Figure 1A:
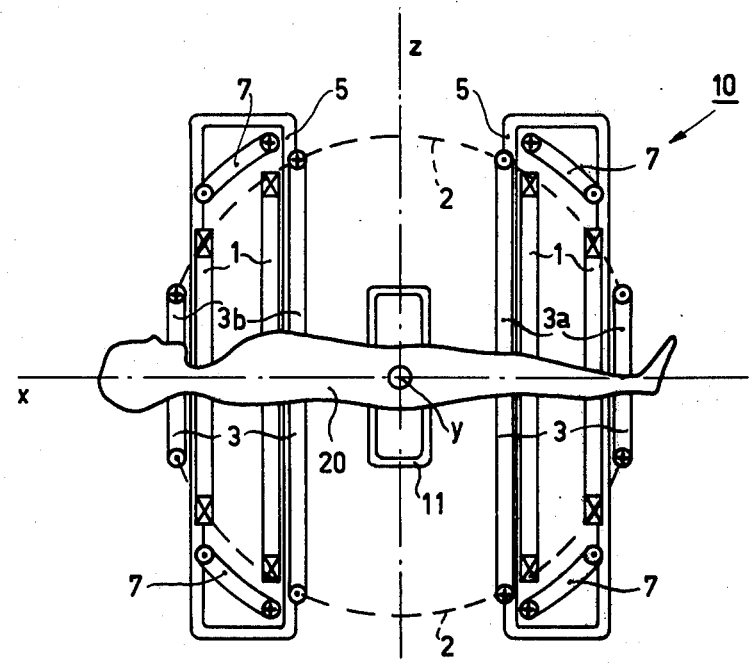

United States Patent [19]

Feiner

[11] 4,354,157

[45] Oct. 12, 1982

[54] METHOD OF AND DEVICE FOR DETERMINING A NUCLEAR SPIN DENSITY DISTRIBUTION IN A PART OF A BODY

[75] Inventor: Louis F. Feiner, Eindhoven, Netherlands

[73] Assignee: U.S. Philips Corporation, New York, N.Y.

[21] Appl. No.: 162,692

[22] Filed: Jun. 24, 1980

[30] Foreign Application Priority Data

Jun. 27, 1979 [NL] Netherlands .......................... 7904986

[51] Int. Cl.³ .......................................... G01N 27/00
[52] U.S. Cl. .................................... 324/312; 324/307; 324/309
[58] Field of Search ................ 324/300, 307, 309, 312

[56] References Cited

U.S. PATENT DOCUMENTS

| | | | |
|---|---|---|---|
| 3,932,805 | 1/1976 | Abe | 324/309 |
| 4,070,611 | 1/1978 | Ernst | 324/309 |
| 4,191,919 | 3/1980 | Haney | 324/307 |
| 4,210,861 | 7/1980 | Tsuda | 324/307 |
| 4,300,096 | 11/1981 | Harrison | 324/309 |

*Primary Examiner*—Michael J. Tokar
*Attorney, Agent, or Firm*—Jack E. Haken

[57] ABSTRACT

It has been found that devices for determining nuclear spin density distributions in an object by means of nuclear spin resonance measurements produce artefacts in the calculated density distributions. The artefacts occurring are dependent of the gradient magnetic fields which are used during the measurements and which influence the excited nuclear spin. The invention concerns two filters for elimination of the artefacts in dependence of the kind of modulation of the gradient magnetic field.

6 Claims, 6 Drawing Figures

METHOD OF AND DEVICE FOR DETERMINING A NUCLEAR SPIN DENSITY DISTRIBUTION IN A PART OF A BODY

The invention relates to a method of determining a nuclear spin density distribution in a part of a body, comprising the following steps:

a. the generating of a stationary and uniform magnetic field,
b. the excitation of nuclear spins in a preselected slice so that the nuclear spins in this slice are oriented transversely of the direction of the uniform field,
c. the subsequent observation and periodic sampling of a free induction signal which is generated by the nuclear spins situated in the slice, the nuclear spins being influenced by at least two gradient magnetic fields whose field directions extend in the direction of the uniform magnetic field, the directions of the field gradients being perpendicular with respect to each other, a first one of said gradient magnetic fields being stationary and the second field being amplitude modulated as a function of the time, a number of N·M samples being taken during a measuring period T,
d. the Fourier transformation of the number of samples in order to obtain nuclear spin density data concerning a nuclear spin density distribution at points which are situated on rows and columns in the selected slice, the rows extending parallel to the gradient direction of the modulated magnetic field, a resolution of the nuclear spin density distribution in the selected slice in the direction of a row being determined by the intensity and the frequency of the modulated field and in the direction of a column by the measuring period T and the intensity of the stationary gradient magnetic field.

The invention furthermore relates to a device for determining a nuclear spin density distribution in a part of a body, comprising (a) means for generating a static and uniform magnetic field,
(b) means for generating at least two gradient magnetic fields whose field direction coincides with the field direction of the uniform magnetic field, the gradient directions extending perpendicularly with respect to each other, a first gradient magnetic field being stationary and a second gradient magnetic field being amplitude modulated as a function of the time,
(c) a high-frequency generator and coil system for generating and detecting a high-frequency electromagnetic field,
(d) a frequency spectrum analyzer for separating a detected high-frequency signal into different frequencies and associated amplitudes,
(e) a memory for the storage of at least the data of the separated high-frequency signal supplied by the analyzer,
(f) an arithmetic unit for determining, on the basis of the data stored, a magnetic nuclear spin density distribution in points situated on rows and columns in the selected slice, each row extending parallel to the gradient direction of the modulated magnetic field,
(g) a reproduction/recording unit for the reproduction and recording, respectively, of the magnetic nuclear spin density distribution determined, and
(h) a central control unit for coordinating the elements mentioned sub (a) . . . (g).

A device of this kind is described in Netherlands patent application No. 77.13.926; the operation of a characteristic embodiment thereof is as follows. The body to be examined is arranged in the static and uniform magnetic field, after which it is excited with a pulse of high-frequency electromagnetic radiation. During this excitation, a stationary gradient magnetic field having a field direction parallel to the direction of the stationary uniform field is also generated. The electromagnetic radiation and the gradient field ensure that nuclear spins in a given thin slice of the body to be examined assume the same position with respect to the uniform magnetic field, the orientation of the nuclear spins enclosing an angle of 90° with respect to the direction of the uniform magnetic field. Thus, a spatial selectivity is achieved in one direction. Immediately after the removal of the electromagnetic radiation and the gradient magnetic field, the free induction decay signal (referred to hereinafter as FID signal) produced in the body by reorientation of the excited nuclear spins is detected by the coil system which also serves to generate the high-frequency electromagnetic radiation. At the same time, the body is subjected to two gradient magnetic fields, the gradient directions of which extend perpendicularly with respect to each other while the field direction thereof extends parallel to the direction of the uniform magnetic field. The intensity of one of the gradient fields is modulated with a squarewave or cosine function. The FID signal then detected contains information concerning the nuclear spin density distribution in the preselected slice. Fourier transformation of the FID signal, having a comparatively narrow band frequency spectrum, produces a set of data concerning resolved cross-sections of the nuclear spin density distribution in the selected slice.

Such cross-sections can also be determined as follows. After excitation by means of a brief high-frequency electromagnetic pulse, three gradients fields are applied whose gradient directions extend perpendicularly with respect to each other, a first field being a stationary field and the two other fields being modulated gradient magnetic fields. The modulation frequencies of both fields are different and the quotient of the highest and the lowest frequency forms an integer number.

However, it has been found that the use of the described method and device results in the reproduction of a nuclear spin density distribution in which artefacts occur. It has also been found that the situation of these artefacts is mirror inverted with respect to an axis representing the line along which the modulated gradient field has the intensity zero.

The invention has for its object to provide a method of and a device for examining a body by means of nuclear spin resonance measurements which produce images of nuclear spin density distribution in which said artefacts are absent.

It has also been found that when use is made of a cosine function for the modulation of the amplitude of a gradient magnetic field, the nuclear spin density data obtained after fourier transformation of the FID signal must be filtered in order to obtain the desired nuclear spin density distribution of the selected slice.

It is a further object of the invention to provide a method and a device incorporating suitable filtering for determining a nuclear spin density distribution from an FID signal obtained with cosine modulation.

To this end, the method in accordance with the invention is characterized in that the data concerning a nuclear spin density distribution at points in each row are convoluted with a weighting function in order to determine a nuclear spin density characteristic number having an index n, said weighting function comprising:

(a) the value 1 for the nuclear spin density data having the index 2n for $|2n| \leq N$, (b) the value $(-1)^{n-n'}/(N \cdot \sin\{(n-n'+\frac{1}{2}) \cdot \pi/N\})$ and $(-1)^{n-n'}/(n \cdot \tan\{(n-n'+\frac{1}{2}) \cdot \pi/N\})$ for the nuclear spin data with an index $2n'-1$ for $|2n'-1| < N$, N being odd and even, respectively, (c) the value 0 for the nuclear spin density data having the index $2n' \neq 2n$, n' and n being real and integer variables for the measured nuclear spin density data and the nuclear spin density characteristic numbers, respectively, N being the maximum number of nuclear spin density characteristic numbers in a row.

The method in accordance with the invention utilizes the nuclear spin density data having odd indices in a row for eliminating the mirror-inverted artefacts in nuclear spin density data having even indices. The cause of the artefacts and the reason why these artefacts are eliminated by means of the described method will be explained at a later stage.

Using the above method, a nuclear spin density distribution is directly obtained by the concolution when the modulated gradient magnetic field is modulated with a squarewave function. Each nuclear spin density characteristic number, therefore, represents the nuclear spin density at a point in the nuclear spin density distribution.

When the gradient magnetic field to be modulated is modulated with a cosine function, a nuclear spin density distribution is not directly obtained, but only after further filtering.

It has been found that the nuclear spin density numbers obtained after convolution of the nuclear spin data by means of the described convolution function represent a spread of a nuclear spin density in a point over an environment of this point.

A preferred method in accordance with the invention where the second gradient magnetic field is modulated with a cosine function is characterized in that from the nuclear spin density characteristic numbers $P_{nm}$ obtained via convolution filtering, a nuclear spin density distribution $\rho$ is calculated as a function of the location ($n'\pi y_o$, $m'z_o$ in a cartesian coordinate system as follows:

$$\rho(n'\pi y_o, n'z_o) = \frac{1}{y_o z_o} \sum_n P_{nm} \cdot F_n^{(N)}(n'\pi)$$

in which $$F_n^{(N)} = \sum_{l=-\infty}^{\infty} F_{n+l \cdot N}(n')$$

where $$F_{k/2}(n'\pi) = \frac{1}{4}(J_{k-1}(n'\pi) + J_{k+1}(n'\pi))$$

$$\sum_{h=-\infty}^{\infty} \frac{(-1)^h}{(1-4h)\pi} \cdot J_{k+2h}(n'\pi)$$

in which n, m are indices in the (y, z) direction, the y direction coinciding with the gradient direction of the modulated field; $y_o = \gamma \cdot W_1/G_y$ and $z_o = \gamma \cdot W_2/G_z$, where $\gamma$ is the gyromagnetic ratio; $W_1$, $G_y$ are the angular frequency and the intensity of the modulated gradient magnetic field, respectively; $W_2$, $G_z$ are the equivalent angular frequency and the intensity of the stationary gradient magnetic field, respectively, where $W_2 = \pi/T$ and T is the measuring period; N is the maximum number of characteristic numbers in the y direction; N.M is the number of periodic samples of the free induction signal during the measuring period T; k, l, h are variable integer and real numbers and $J_l$ are Bessel functions, the summing over n for the determination of a value of $\rho(y, z)$ extending from $-N'$ to $+N'$ for N odd, and from $-N'$ to $N'+1$ for N even, N being equal to $2N'+1$ and $2N'$, respectively.

When the modulated gradient field is modulated with a squarewave function, the convolution directly produces a nuclear spin density distribution when the above method is used. Each nuclear spin density characteristic number, therefore, is a nuclear spin density value at a point in the nuclear spin density distribution.

As a result of the described filtering, the nuclear spin density distribution is determined from the nuclear spin density characteristic numbers and the spread caused by the cosine modulated gradient magnetic field is eliminated.

A device in accordance with the invention is characterized in that the arithmetic unit comprises a convolution filter for convolution groups of nuclear spin density data, each of said groups of nuclear spin density data relating to a row, the filter coefficients of the convolution filter for determining a nuclear spin density characteristic number with an index n having the values:

a. 1 for the nuclear spin density data having the index 2n for $|2n| < N$, b. $(-1)^{n-n'}/(N \cdot \sin\{(n-n'+\frac{1}{2}) \cdot \pi/N\})$ and $(-1)^{n-n'}/(N \cdot \tan\{(n-n'+\frac{1}{2}) \cdot \pi/N\})$ for the nuclear spin density data having the index $2n'-1$ for $/2n'-1/ < N$, N being odd and even, respectively, c. 0 for the nuclear spin density data having the indices $2n' \neq 2n$; n and n' being real, integer variables for the measured nuclear spin density data and the nuclear spin density characteristic numbers to be determined, respectively, N being the maximum number of nuclear spin density characteristic numbers in a row.

A device of this kind offers the advantage that an image without mirror-reverse effects is obtained with only few additional means.

A preferred embodiment of a device in which the amplitude of the second gradient magnetic field is modulated with a cosine function in accordance with the invention is characterized in that the arithmetic unit comprises a further filter for filtering the nuclear spin density numbers $P(n-m)$ in a row, obtained via the convolution filter, in order to determine nuclear spin density values in points having the coordinates ($n'\pi y_o$, $m'z_o$), the filter being determined by $$\psi_{nm}(n'\pi y_o, m'z_o) = F_n^{(N)}(n'\pi) \cdot \delta_{mm'}$$

in which $$F_n^{(N)}(n'\pi) = \sum_{l=-\infty}^{\infty} F_{n+lN}(n'\pi)$$

where $$F_{k/2}(n'\pi) = \frac{1}{4}(J_{k-1}(n'\pi) + J_{k+1}(n'\pi)) +$$

-continued $$\sum_{h=-\infty}^{\infty} \frac{(-1)^h}{(1-4h)\cdot\pi} \cdot J_{k+2h}(n'\pi)$$

in which n,m are indices in the (y,z) direction, the y direction coinciding with the gradient direction of the modulated field; $y_o=\gamma\cdot W_1/G_y$ and $z_o=\gamma\cdot W_2/G_z$, $\gamma$ being the gyromagnetic ratio, $W_1$, $G_y$ are the angular frequency and the intensity of the modulated gradient magnetic field, respectively, $W_2$, $G_z$ are the equivalent angular frequency and the intensity of the stationary gradient magnetic field, respectively, where $W_2=\pi/T$ and T is the measuring period; N is the maximum number of characteristic numbers in the y direction; N·M is the number of periodic samples of the free induction signal during the measuring period T; k, l, h are variable, integer and real numbers abd $J_i$ are Bessel functions, the summing over n for the determination of a value of $\rho(y, z)$ extending from $-N'$ to $N'$ for N odd, and from $-N'$ to $N'-1$ for N even, N being equal to $2N'+1$ and $2N'$, respectively.

The invention will be described in detail hereinafter with reference to an embodiment which is elaborated in a drawing.

FIGS. 1a, b, c diagrammatically show a coil arrangement of a device for performing the method in accordance with the invention.

Figure 3:
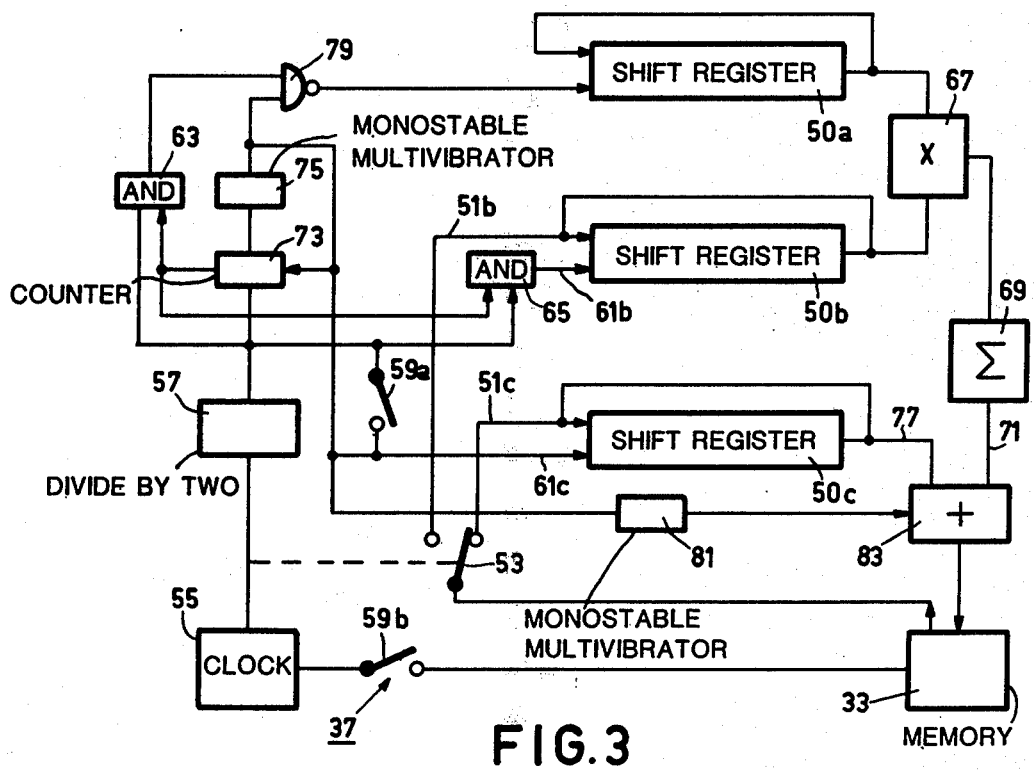
Figure 2:
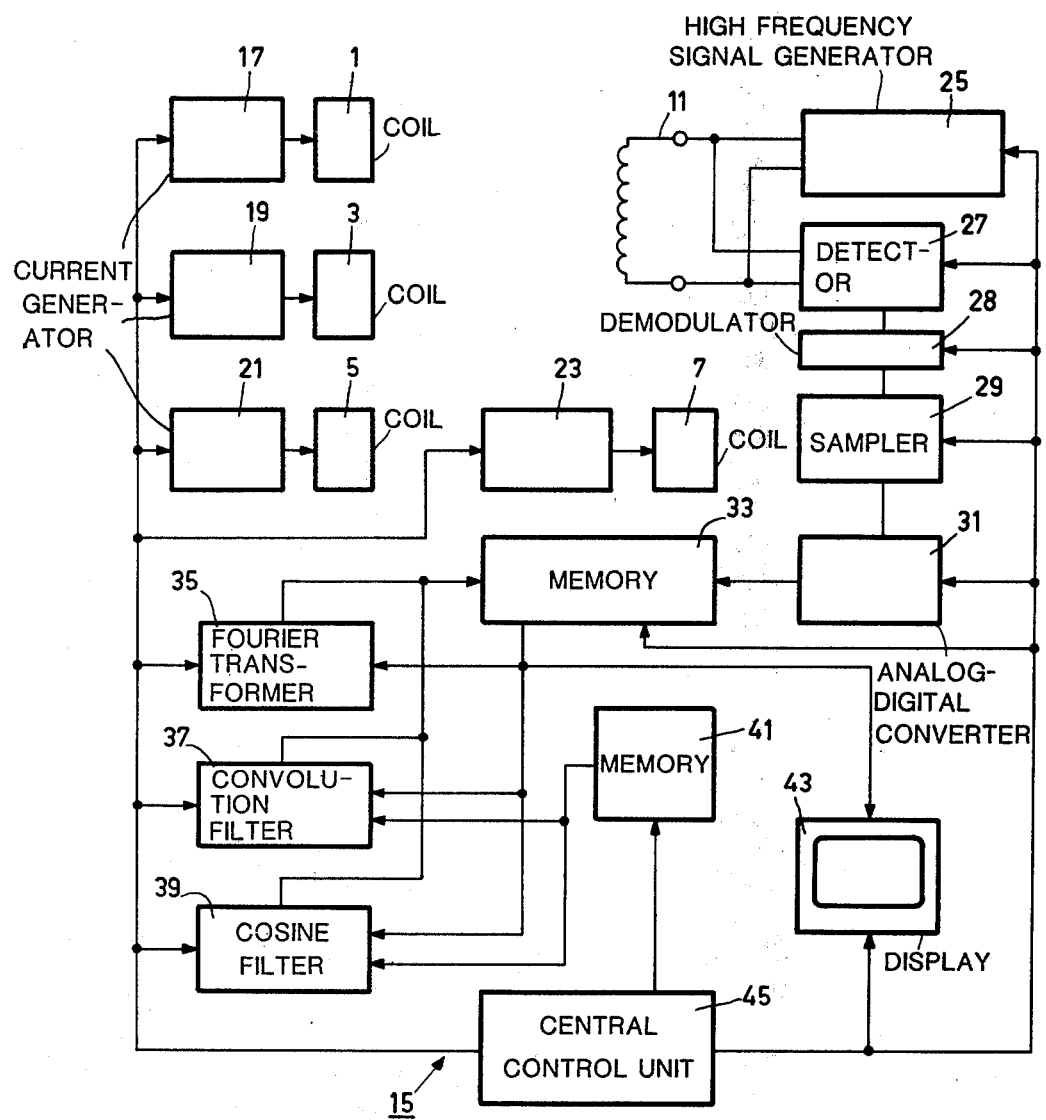
Figure 4:
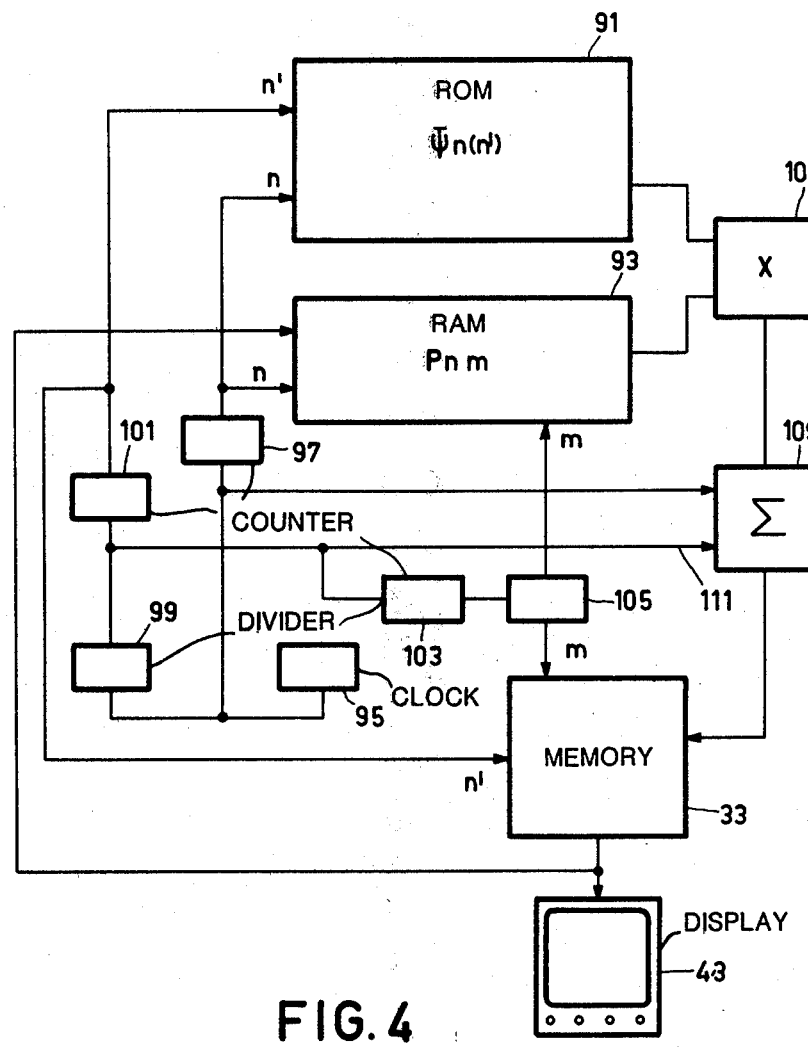

FIG. 2 is a diagrammatic view of the parts of a device in accordance with the invention, FIG. 3 shows an embodiment of a convolution filter for a device in accordance with the invention, and FIG. 4 shows a preferred embodiment of a filter for a device in accordance with the invention.

FIG. 1a shows a coil system 10 of a device in accordance with the invention for determining a nuclear spin density distribution in a slice of a body 20; this slice may form part of the y-z plane of the coordinate system x·y·z shown. The y axis of the system is directed upwards; perpendicularly to the plane of the drawing. The coil system 10 generates a uniform stationary magnetic field $B_{xo}$, having a field direction parallel to the x axis, three gradient fields $B_x$, $B_1$ and $B_2$, having a field direction parallel to the x axis and a gradient direction parallel to the x, y and the z axis, respectively, and a high-frequency magnetic field. To this end, the coil system 10 comprises some principal coils 1 for generating the stationary uniform magnetic field $B_{xo}$, having an intensity of some tenths of a tesla. The principle coils 1 may be arranged, for example, on the surface of a sphere 2, the centre of which is situated in the origin O of the cartesian coordinate system x, y, z shown, concentrically to the x axis.

The coil system 10 furthermore comprises four coils $3_{a,b}$ for generating the gradient magnetic field $B_x$ which are arranged on the same sphere surface and which are concentric to the x axis. To this end, a first set of 3a is excited in the opposite sense with respect to the passage of current through the second set 3b; this is denoted by ⊙ and ⊕ in the Figure. Therein, ⊙ means a current flowing into the section of the coil 3 and ⊕ means a current emerging from the section of the coil. This notation will be constantly used hereinafter.

Figure 1B:
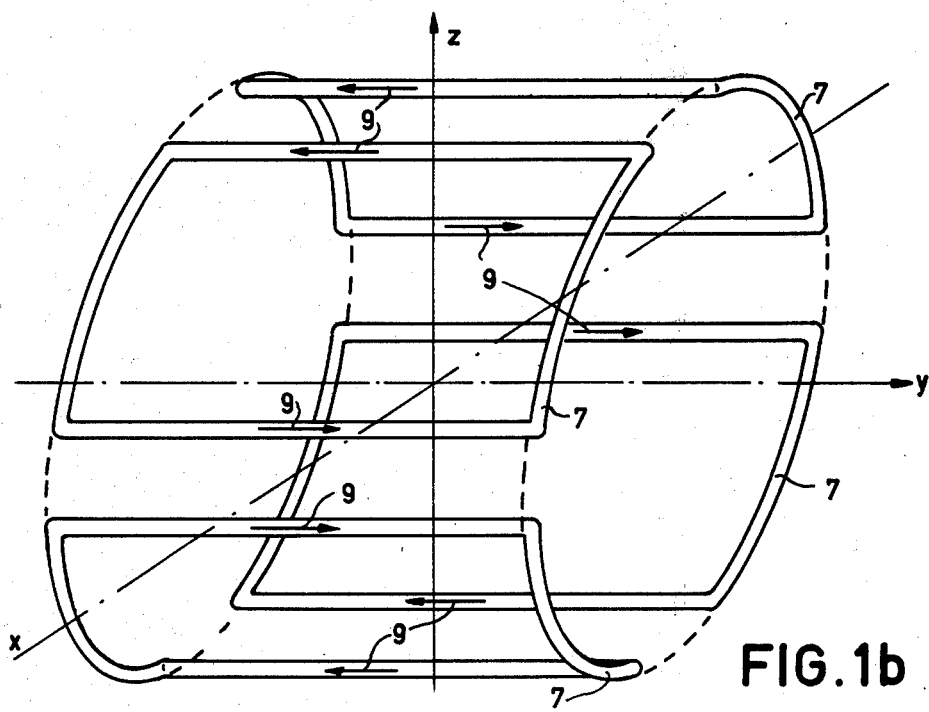

The coil system 10 comprises four rectangular coils 5 (only two are shown) for generating the gradient magnetic field $B_1$, the coils 5 being situated on a circular-cylinder surface, the cylinder enclosing the sphere 2 and the cylinder axis coinciding with the z axis. For the generating of the gradient magnetic field $B_2$, use is made of four coils 7 which have the same shape as the coils 5 and which are rotated through an angle of 90° around the x axis with respect to the coils 5. FIG. 1b shows a perspective view in order to give a better impression of the shape of the coils 7 (and 5). The direction in which an electric current passes through the coils 7 is indicated by means of arrows 9.

Figure 1C:
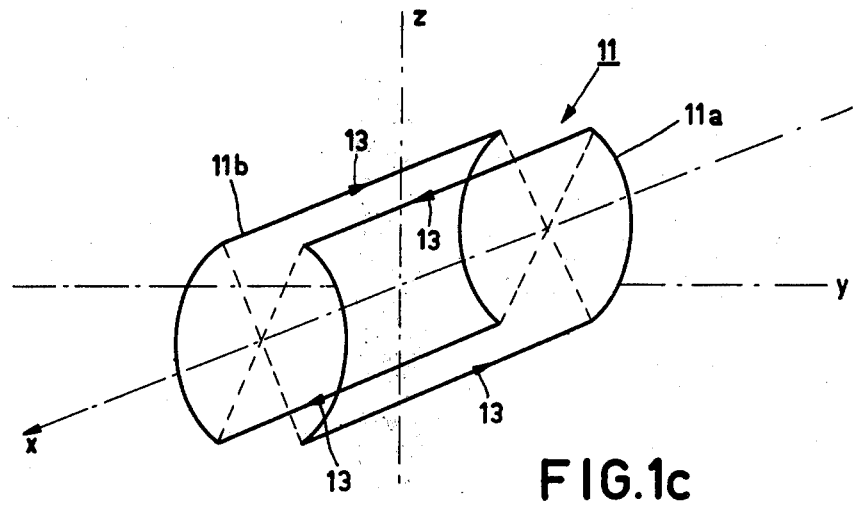

FIG. 1a also shows a coil 11 for generating and detecting a high-frequency electromagnetic field. FIG. 1c is a perspective view of the coil 11. The coil 11 comprises two halves 11a and 11b which are electrically interconnected so that the current directions denoted by the arrows 13 are obtained during operation.

FIG. 2 shows a device 15 in accordance with the invention. The device 15 comprises the coils 1, 3, 5, 7 and 11 already described with reference to the FIGS. 1a, b and c, current generators 17, 19, 21 and 23, for exciting the coils 1, 3, 5 and 7, respectively, and a high-frequency signal generator 25 for exciting the coil 11. The device 15 furthermore comprises a high-frequency signal detector 27, a demodulator 28, a sampling circuit 29, an analog-to-digital converter 31, a memory 33, an arithmetic circuit 35 for executing a Fourier transformation, a convolution filter 37, a cosine filter 39, a coefficient memory 41, a display device 43, and a central control unit 45, the functions and mutual relationships of which will be described at a later stage.

A method in accordance with the invention is performed as follows by means of the device 15. When the current generators 17 and 19 are switched on by the central control unit 45, the coils 1 and 3 are excited. A stationary and uniform magnetic field $B_{xo}$ and a stationary gradient magnetic field $\delta B_{xo}/\delta_x$ are then generated. Furthermore, the high-frequency generator 25 is switched on for a brief period of time, so that the coil 11 generates a high-frequency electromagnetic field. As a result of the applied magnetic fields, the nuclear spins in and in the direct vicinity of the y-z plane in the body 20 can be excited, the excited nuclear spin magnetization enclosing a given angle, for example, 90°, with respect to the uniform magnetic field $B_{xo}$, the magnetization having the same direction throughout the plane. The plane (parallel to the y-z plane) in whch the nuclear spins are excited depends on the intensity of the field $B_{xo}$, of the gradient magnetic field $B_x$ and of the nuclear frequency $W_o$ of the high-frequency electromagnetic field, because the equation $B_o=W_o/\gamma$ is to be satisfied, in which $B_o$ is the overall intensity of the magnetic field caused by $B_{xo}$ and $B_x$ and $\gamma$ is the gyromagnetic ratio. After an excitation period, the high frequency generator 25 and the generator 19 for the gradient magnetic field $B_x$ are switched off by the central control unit 45, which at the same time switches on the generators 21 and 23 for a measuring period T. At the same time, the high frequency detector 27, the demodulator 28, the sampling circuit 29 and the analog-to-digital converter 31 are switched on. The generators 21 and 23 generate the gradient magnetic fields $B_1$ and $B_2$, respectively, during the measuring period T, the detected and demodulated free induction signal referred to hereinafter as FID signal) then being periodically sampled by the circuit 29. The gradient field $B_2$ is a stationary field and the gradient field $B_1$ is magnetic field modulated square-wave or cosine in the time.

The analog sampled FID signals from the sampling circuit 29 are converted into digital form (converter 31) and stored in a memory 33. After expiration of the measuring period T, the central control unit 45 stops the generators 17, 21 and 23, the detector 27, the sampling circuit 29, and the digital-to-analog converter 31.

The sampled FID signal is stored in the memory 33 and, after Fourier transformation in the arithmetic circuit 35, it will produce a spectrum of frequencies whose amplitudes contain data concerning nuclear spin densities at points determined by the frequencies associated with the amplitudes. Unfortunately, a translation from a frequency to a (point) location is not possible. Therefore, the spectrum supplied by the arithmetic circuit 35 is first stored in the memory 33. The type of modulation of the time-dependent gradient magnetic field $B_1$ determines how the translation to location can be realized.

When an arbitrary modulation is used, the following is applicable:

$$B_1(y,t) = G_y \cdot y \cdot f(t) \text{ and}$$

$$B_2(z,t) = G_z \cdot z \text{ for } 0 < t < T \quad (20)$$

in which $B_1(y, t)$ is the modulated gradient field and $B_2(z, t)$ is the stationary gradient field.

The total magnetic field present during the measuring period T is: $\overline{B}_o + \overline{B}_1 + \overline{B}_2$. In the total magnetic field, each nuclear spin, and hence the magnetization at each element of the selected slice, precesses about the field direction (x direction) at a circular frequency which is determined by the overall field strength. With respect to cartesian coordinate system, which itself rotates at a frequency $\gamma \cdot B_0$ around the x axis, the magnetization in the elements (at the area y, z) is described by:

$$m(y,z,t) = \exp\left[ i \cdot \gamma \cdot \int_0^t \{B_1(y,t') + B_2(z,t.)\} dt. \right] \quad (1a)$$

$$= \exp[i(\phi_1(y,t) + \phi_2(z,t))] \quad (1b)$$

in which $$\phi_1(y,t) = (G_y \cdot Y \cdot \gamma) \cdot \int_0^t f_1(t')dt' \text{ and} \quad (1c)$$

$$\phi_2(z,t) = t \cdot G_z \cdot z \cdot \gamma. \quad (1d)$$

The signal received by the high-frequency coil 11 and the high-frequency detector 27 and demodulated by the demodulator 28 is the sum of all magnetizations of all excited nuclear spins in all elements of the selected slice. The FID signal M(t) can then be written as:

$$M(t) = \int_{-Y}^{Y} dy \cdot \int_{-Z}^{Z} dz \cdot \rho(y,z) \cdot m(y,z,t) \quad (2)$$

in which $-Y, Y, -Z$ and $Z$ bound the slice containing the excited nuclear spins and $\rho(y,z)$ represents the nuclear spin density in a point (y, z).

In view of the periodicity of the field $B_1$ and the finite duration (measuring period T), the formule (2) can be rewritten as:

$$M(t) = \sum_{k=-\infty}^{\infty} \int_{-Y}^{Y} dy \cdot \int_{-Z}^{Z} dz \cdot \rho(y,z) \cdot \phi_k(y,z) \cdot e^{ik\omega_2 t} \quad (3)$$

in which $$\overline{\phi}_k(y,z) = \sum_{n=-\infty}^{\infty} \alpha_n(y) \cdot \beta_{k-n \cdot M}(z) \quad (4)$$

and $$\alpha_n(y) = \frac{M}{2T} \int_{-T/M}^{T/M} e^{i\phi_1(y,t)} \cdot e^{in\omega_1 \cdot t} dt \quad (5)$$

$$\beta_m(z) = \frac{1}{2T} \int_{-T}^{T} e^{i\phi_2(z,t)} \cdot e^{im\omega_2 \cdot t} dt \quad (6)$$

In these formulas, $w_2 = \pi/T$ and $w_2 \cdot M = w_1$, $w_1$ being the angular frequency of the modulated field and n, m and k are variable integer numbers.

In the formule (3), the signal M(t) is written as a sum of signals, each of which has its own discrete frequency and amplitude.

Each frequency $kw_2$ associated with it the amplitude $$M_k = \int_{-Y}^{Y} dy \int_{-Z}^{Z} \rho(y,z) \cdot \overline{\phi}_k(y,z) \quad (7)$$

The signal M(t) measured by the detector 27 could be Fourier transformed according to:

$$M_k = \frac{1}{2T} \int_{-T}^{T} M(t) \cdot e^{ik\omega_2 t} dt \quad (8)$$

because the signal M(t) supplied by the detector 27 is sampled (N×M times during the measuring period T), the sampled signals must be Fourier transformed. The following spectrum is then obtained:

$$M'_k = \frac{1}{2N \cdot M} \sum_{j=-NM}^{NM} M(t_j) \cdot e^{ilj \cdot \pi/NM} \quad (9)$$

by sampling at the instants $t_j = j \cdot T/NM$, assuming that $M(t) = M^*(-t)$, $M^*$ being the conjugated signal of M(t).

If the FID signal is sampled, formula 7 becomes $$M'_k = \int_{-Y}^{Y} dy \int_{-Z}^{Z} dz \cdot \rho(y,z) \cdot \overline{\phi}'_k(y,z) \quad (10)$$

in which $$\overline{\phi}'_k = \sum_{n=-N}^{N-1} \alpha_n^{(2N)}(y) \cdot \beta_{k-n \cdot M}^{(2NM)}(z) \quad (11)$$

where $$\alpha_n^{(2N)}(y) = \sum_{p=-\infty}^{\infty} \alpha_{n+1 \cdot 2N}(y) \text{ and} \quad (12)$$

$$\beta_m^{(2NM)}(z) = \sum_{l=-\infty}^{\infty} \beta_{m+1 \cdot 2NM}(z)$$

Thus, $$\alpha_m^{(2NM)}(z) = \frac{\sin\{(z/z_o - m) \cdot \pi\}}{2NM \tan\{(z/z_0 - m) \cdot \pi/2 NM\}} \quad (13)$$

If the gradient magnetic field $B_1$ is squarewave modulated, the function is:

$$a_n^{(2N)}(y) = \frac{1}{2}\left[ \frac{\sin\{(y/y_o - n)\cdot \pi/2\}}{N\cdot \sin\{(y/y_o - n)\cdot \pi/2N\}} + \right.$$

$$\left. (-1)^n \frac{\sin\{(y/y_o + n)\cdot \pi/2\}}{N\cdot \sin\{(y/y_o + n)\cdot \pi/2N\}} \right] \quad (14)$$

when N is an odd number. When N is even, the sine functions in the denominator are replaced by a tangent function.

Because of the special appearance of $\beta_m^{2NM}(z)$ see (13), only one of the many terms comprised by $\bar{\phi}'_k$ contributes significantly to the weighted integral (10) determining the value (amplitude) $M'_k$. If $nM+m$ is substituted for k, $$M_{nM+m} \approx \int_{-Y}^{Y} dy \int_{-Z}^{Z} dz \cdot \rho(y,z) \cdot a_n^{(2N)}(y) \cdot \quad (15)$$

$$\beta_m^{(2NM)}(z)$$

Considering the coefficient $a_n(2N)$, it appears that the nuclear spins in a zone at the area of $(ny, mz_o)$ mainly contribute to $M'_{nM+m}$ and to $M'_{-nM+m}$. Conversely, a coefficient found $(M_{nM+m})$ from the Fourier transformation will make a contribution to the spin density at the point $(+ny_o, mz_o)$ and at the point $(-ny_o, mz_o)$.

Formulas (7) and (8) show that a detected spectrum contains a set of signals each of which has its own frequency $kw_2$, the amplitude $M_k$ thereof being a weighted integral of the nuclear spin density distribution, multiplied by an associated weighting function. It will be clear that the weighting function $\bar{\phi}_k(y,z)$ depends on the gradient fields $B_1$ and $B_2$ and on the kind of modulation thereof.

The nuclear spin density distribution $\rho(y,z)$ can be written in a progression with coefficients $P_j$ and a set of functions $\{\bar{\psi}_j(y, z)\}$ $$\rho(y,z) = \sum_j P_j \cdot \Psi_j(y,z) \quad (16)$$

In accordance with the formule (7):

$$M_k = \sum_j P_j \cdot A_{jk} \quad (17)$$

in which $A_{jk}$ is a matrix whose elements are determined by $$A_{jk} = \int\int \bar{\psi}_j(y, z)\cdot \bar{\phi}_k(y, z)\, dy\cdot dz \quad (18)$$

and where the coefficients $P_j$ follow from $$P_j = \sum_{k=-\infty}^{\infty} M_k \cdot (A^{-1})_{kj} \quad (19)$$

It will be clear that this calculation is valid only if the matrix $A_{jk}$ has an inverse, which means that the amplitudes $M_k$ should contain all information concerning the coefficients $P_j$.

If $\bar{\phi}_k(y, z)$ is a system of orthogonal functions, the following is applicable:

$$\rho(y,z) \approx \sum_{k=-\infty}^{\infty} M_k \cdot \bar{\phi}_k(y,z) \quad (20)$$

In an ideal case, the function $\bar{\phi}_k(y, z)$ will be such that each weighted integral $M_k$ (formula 7) produces a value of the nuclear spin density in one separate point in the excited zone. As has already been seen for $a_n^{(2N)}(y)$ (formule (14)), this is not the case for squarewave modulation in given circumstances.

The coefficients $a_n(y)$ and $\beta_m(z)$ expressed in the functions (5) and (6) both satisfy the relations:

$$\beta_m(z) = \beta_{-m}(z) \quad (21)$$

$$\sum_{k=-\infty}^{\infty} \beta_{m-k}(z) \cdot \beta_k(z') = \beta_m(z + z') \quad (22)$$

Furthermore, $a_n(y)$ satisfies the relation $$a_n(-y) = a_{-n}(y) = (-1)^n a_n(y) \quad (23)$$

because of the symmetry: $f_1(t+\pi/w_1) = -f_1(t)$ which is imposed in the case of a squarewave or cosine modulation of the gradient magnetic field B'. Furthermore, it is applicable (formula 6) that $$\beta_m(z) = \frac{\sin(\pi(z - z_o\cdot m)/z_o)}{\pi(z - z_o\cdot m/z_o)} = w_m(z/z_o) \quad (24)$$

For a squarewave modulated gradient magnetic field having the frequency $w_1$, it can be calculated by means of (5) that, if:

$$f_1(t) = +1 \text{ for } -\pi/2w_1 + 1.2\pi/w_1 < t < \pi/2w_1 + 1.2\pi/w_1$$

$$f_1(t) = -1 \text{ for } +\pi/2w_1 + 1.2\pi/w_1 < t < 3\pi/2w_1 + 1.2\pi/w_1$$

the factor $a_n(y) = v_n(y/2y_o)$ $$a_n(y) = \frac{1}{2}\left[ \frac{\sin\{\pi(y - ny_o)/2\cdot y_o\}}{\pi(y - ny_o)/2y_o} + \right.$$

$$\left. (-1)^n \frac{\sin\{\pi(y + n\cdot y_o)/2y_o\}}{\pi(y + ny_o)/2y_o} \right] \quad (25)$$

The factor $\bar{\phi}_k(y, z)$ in the formule (4) can then be rewritten, if for k the factor $nM+m$ is substituted, as:

$$\bar{\phi}_{nM+m}(y,z) = \sum_{l=-\infty}^{\infty} a_l(y)\cdot \beta_{m+(n-l)\cdot M}(z) \quad (26)$$

For $n \neq l$, a term $al(y)\cdot \beta_{m+(n-l)\cdot M}(z)$ will then indicate a zone which is situated outside the boundary $(-z, z)$, because $M\cdot z_o$ defines this boundary and the body to be examined is situated within the boundary. Therefore, $$\bar{\phi}_{nM+m}(y, z) \approx a_n(y)\cdot \beta_m(z) = \zeta_n(y/2y_o)\cdot \omega_m(z/z_o) \quad (27)$$

It appears that only half of the functions is independent, because the formule (23) should be satisfied. It can also be seen that an element dimensioned $y_o \times z_o$ and situated on $(n\cdot y_o, m\cdot z_o)$ makes a contribution mainly (see formule 7) to $(M_k=) M_{nm+m}$ and to $M_{-nM+m}$. Obviously, as has already been stated with reference to the formule (14), a contribution to the amplitude with the frequency index $(nM+n)$ is made by an element having the coordinates ($ny_o$, $mz_o$) as well as by the element having the coordinates ($-ny_o$, $mz_o$).

It can also be seen that an image of a nuclear spin density distribution can be obtained in which the mirroring of $ny_o$ to $-ny_o$ does not occur due to a transformation of the detected frequency spectrum. In the formule (27), the function $w_m(z/z_o)$ forms part of a system of orthogonal functions in which $z_o$ represents the distance between the maximum values of the successive individual functions. Furthermore, the maximum values of the two terms of $a_n(y)$ (see formule 25), determining the y-dependence of $\bar{\phi}_{nM+m}(y,z)$, have a width $2y_o$, whilst corresponding terms in the successive functions $a_n(y)$ exhibit maximum values which are situated only at the distance $y_o$ from each other, said distance being too small to allow these terms to be independent. Therefore, the terms having a maximum value at an odd number of times $y_o$ can be expressed in terms with an even number of times $y_o$. Thus, a set of independent functions can be created which exhibit a single maximum value at either a positive or a negative number of times $2 \cdot y_o$.

A set of functions is defined according to:

$$\bar{\psi}_{nm}(y,z) = w_n(y/2y_o + (z/z_o - m)/2M) \cdot w_m^{(M)}(z/z_o) \tag{28}$$

in which $$w_m^{(M)} = \sum_{l=-\infty}^{\infty} w_{m+lM}(z/z_o) = \frac{\sin(\pi(z - mz_o)/z_o)}{M\sin(\pi(z - mz_o)/Mz_o)} \tag{29}$$

The functions $\bar{\psi}_{nm}(y, z)$ then have a relationship with the functions $\bar{\phi}_k(y,z)$ formule 26) which implies the following:

$$\bar{\psi}_{nm}(y,z) = \bar{\phi}_{2nM+m}(y,z) + \sum_{n'=-\infty}^{\infty} S_{nn'} \cdot \bar{\phi}_{(2n'-1)M+m}(y,z) \tag{30}$$

in which $$S_{nn'} = (-1)^{n-n'}/\{(n - n' + \tfrac{1}{2}) \cdot \pi\} \tag{31}$$

It follows directly therefrom that the nuclear spin density characteristic numbers are defined by:

$$P_{nm} \iint \rho(y,z) \cdot \bar{\psi}_{nm}(y,z) \, dy\, dz \tag{32a}$$

and are given by convolution of the nuclear spin density data $M_k$:

$$P_{nm} = M_{2nM+m} + \sum_{n'=-\infty}^{\infty} S'_{nn'} \cdot M_{(2n'-1) \cdot M+m} \tag{32b}$$

The formule (32b) indicates filtering of the spectrum which is obtained via the demodulator 28 and which eliminates the mirroring of the contributions in the nuclear spin density distribution on both sides of the y-axis.

After execution of the filtering, the spin density distribution can be calculated after the rewriting of formule (16):

$$\rho(y,z) = \frac{1}{2y_o z_o} \cdot \sum_{n=-\infty}^{\infty} \cdot \sum_{m=-M'}^{M'} P_{nm} \cdot \bar{\psi}_{nm}(y,z) \tag{33}$$

It is to be noted that via formule (33), not only a $\rho(y,z)$ at the points ($2ny_o$, $mz_o$) can be calculated, but also at intermediate points.

In the case of cosine modulation of the gradient magnetic field $B_1$, so where $f_1(t)=\cos(w_1t)$, it is applicable that:

$$a_n(y) = J_n(y/y_o) \tag{34}$$

where $J_n(\ldots)$ is a Bessel function.

It can be deduced (like for modulation of the gradient magnetic field by means of a squarewave signal) that:

$$\rho(y,z) = \frac{1}{y_o z_o} \cdot \sum_{n=-\infty}^{\infty} \sum_{m=-M'}^{M'} P_{nm} \cdot \Psi'_{nm}(y,z) \tag{35}$$

in which $$P_{nm} = M_{2nM+m} + \sum_{n'=-\infty}^{\infty} S_{nn'} \cdot M_{(2n'-1)M+m} \tag{32b}$$

and $$\Psi'_{nm}(y,z) = F_{n-(z/z_o-m)/2M}(y/y_o) \cdot \omega_m^{(M)}(z/z_o) \tag{36}$$

where $$F_{n/2}(x) = \tfrac{1}{4}(J_{n-1}(x) + J_{n+1}(x)) + \sum_{l=-\infty}^{\infty} \frac{(-1)^l}{(1 - 5l) \cdot \pi} \cdot J_{n+2}(x) \tag{37}$$

It is to be noted that in the case of cosine modulation, a first filtering operation is performed which is identical to the first filtering operation in the case of squarewave modulation of the gradient magnetic field $B_1$ (see formule 32B). If the nuclear spin density numbers $P_{nm}$ have been determined after the first filtering operation by filtering of nuclear spin density data, the nuclear spin density $\rho(y, z)$ in the point $(y,z)$ is determined by a second filtering operation with a filter $\bar{\psi}_{nm}(y,z)$ or $\bar{\psi}'_{nm}(y,z)$, depending on the kind of modulation.

If the nuclear spin density $\rho$ is calculated only in the matrix points ($2y_o$, $z_o$) in the case of squarewave modulation, it has been found that after the first filtering operation the nuclear spin density characteristic numbers $P_{nm}$ already represent the nuclear spin density at the points ($2ny_o$, $mz_o$), because the function $\bar{\psi}_{nm}(n' \cdot 2y_o, m'z_o)$ has the value 1 for $n=n'$ and $m=m'$ and the value 0 for $n \neq n'$ or $m \neq m'$.

When the nuclear spin density $\rho$ is calculated only in the matrix points ($n' \cdot \pi \cdot y_o$, $mz_O$) in the case of cosine modulation, it appears that the two-dimensional filter $\bar{\psi}$ $(n,m)(y,z)$ changes into a one-dimensional filter $\bar{\psi}$ n.m $(n' \cdot \pi \cdot y_{oz}, m'z_o)$, because the function $w_m^{(M)}(z/z_o)$ (see formula 36) should then be considered a $\rho$-function which has the value 0 for $m \neq m'$ and the value for $m=m'$.

For points which are situated between the matrix points ($2ny_o$, $mz_o$) and ($n' \cdot \pi \cdot y_o, mz_o$), obviously, nuclear spin densities can also be calculated by standard, known interpolation procedures. The nuclear spin densities obtained via the interpolations, however, are then approximations of the actual values.

The mirroring with respect to the z axis is eliminated by means of a filter defined by the formula (32b). The coefficients of the formulae (32b), however, are not valid when the signal $M(t)$ (formula 2) is sampled. It can be calculated (see formulas (10), (11) and (12)) that, when the free induction signal $M(t)$ is sampled, a slightly adapted filter has to be used, the coefficients thereof being defined as follows:

$$S_{nn'} = (-1)^{n-n'}/N\{\sin\{(n - n' + \tfrac{1}{2})\pi/N\}$$
or
$$= (-1)^{n-n'}/N\{\tan\{(n - n' + \tfrac{1}{2})\pi/N\}$$

when N is odd or even, respectively. The filter described by the formulas (36) and (37) should also be slightly adapted, as will be explained hereinafter.

An embodiment of a filter of a device in accordance with the invention for eliminating the mirroring with respect to the z axis will be described with reference to FIG. 3. The values stored in the memory 33 and supplied by the arithmetic circuit 35 are applied to a filter 37. The filter 37 comprises three shift registers 50a, 50b and 50c which contain the filter coefficients, the nuclear spin density data of odd index and the nuclear spin density data of even index, respectively. Each of the registers 50b and 50c comprises an input 51b and 51c which is connected, via a switch, to an output of the memory 33 and via which the nuclear spin density data of a row are input into the shift registers 50b and 50c. In reaction to each pulse generated by the clock 53, the switch 53 switches over, so that the nuclear spin density characteristic data are alternately applied to the registers 50b and 50c. The pulses are applied, via a two-divider 57, to the clock inputs 61b and 61c (the switches 59a and 59b are then closed), so that the content of the register is shifted one location further after a nuclear spin density data has been applied to each register 50b and 50c. After all nuclear spin density data of a row has been read, the switches 59a and 59b are opened and filtering can take place.

The weighting factors $S_{nn'}$ are stored in the register 50a. Via AND-gates 63, 65, the pulses conducted by the two-divider 57 are applied to the registers 50a and 50b, so that the weighting coefficients and the nuclear spin density data of odd index are applied to a multiplier 67. The products determined by means of the multipliers 67 are applied to a summing circuit 69 which outputs the sum of all products applied on an output 71. After all nuclear spin density data of odd index have been multiplied by a weighting factor and summed, the gates 63 and 65 are blocked by a signal on an output of a counter 73, the position of which equals the number of weighting coefficients. A further output of the counter 73 supplies an additional pulse, via a monostable multivibrator 75, which is applied to the shift register 50c. On an output 77 of the shift register 50c, the nuclear spin density data $M'_{2n}$ appears which is added, in the adder circuit 83, to the sum presented on the output 71. Via a monostable multivibrator 81, an additional pulse is applied to the adder circuit 83 which returns the result of the addition P'n to the memory 33. Via gate circuit 79, a pulse is also applied to the shift register 50a, so that the coefficients $S_{nn'}$ are shifted one position further with respect to the nuclear spin density data $M'_{(2N-1)}$ for the determination of $P_{n+1}$. After resetting of the counter 73 on the input 85, a next nuclear spin density characteristic number is determined.

After determination of all nuclear spin density characteristic numbers (by counting of the pulses applied to the monostable multivibrator 81), the nuclear spin density data of a next row can be input into the registers 50b and 50c by the switching over of the switch 59b.

Formulas (36) and (35) indicate how, when the gradient magnetic field $B_1$ is cosine modulated, the nuclear spin density characteristic numbers $P_{nm}$ obtained via the filter 37 (FIG. 3) have to be filtered in order to find a nuclear spin density at the point $(n'\pi y_p, mz_o)$. The formula given, however, is derived for analog signals. Because the signal $M_{(t)}$ is sampled, the filter is determined by $$\Psi_{nm}(n'\pi y_o, m'z_0) = F_n^{(N)}(n'\pi) \cdot \delta_{mm'} \quad (38)$$

in which $$F_n^{(N)}(n'\pi) = \sum_{1=-\infty}^{\infty} F_{n+1N}(n'\pi)$$

and $F_{n+1N}$ satisfies the formula (37).

FIG. 4 shows a circuit for performing the filtering according to (38). It can be seen that from the N×M nuclear spin density characteristic numbers $P_{nm}$ a number of $[2N/\pi]$×M independent nuclear spin densities can be calculated, "$2N/\pi$] indicating the largest integer number smaller than the value $2N/\pi$. It will also be understood that the filtering is dependent only of the point n' to be determined and the index n. It will also be clear that for each point n' for which a nuclear spin density is calculated, another system of N coefficients is required, so that for the calculation of $[2N/\pi]$ different nuclear spindensities, N×$[2N/\pi]$ filter coefficients are required. The filter coefficients are stored in a read only memory (ROM) 91. Furthermore, a random access memory (RAM) 93 stores the nuclear spin density characteristic number $P_{nm}$ of each row, determined via the filter 37, m being the index of a row. A clock 95 generates pulses which are applied to an address counter 97. The total number of pulses which forms a part of the address of a filter coefficient $\overline{\psi}_n(n')$ of a characteristic number $P_{nm}$ appears on the output of the counter 97. The clock pulses are also applied to a pulse divider 99 which divides the number of pulses by N. The output of the divider 99 is connected to a counter 101, the position of which indicates the number (n') of nuclear spin densities calculated to complete the address for the filter coefficient $\overline{\psi}_n(n')$ to be fetched. The output of the divider 99 is also connected to a second divider 103, which divides the pulses from the divider 99 by $[2N/\pi]$. The output of the divider 103 is connected to a counter 105, the position of which indicates the row (m) in which filtering takes place. The output of the address counter 97 (n) and the output of the counter 105 together form an address (n, m) of the nuclear spin density characteristic number to be multiplied by the filter coefficient $\overline{\psi}_n(n')$. Both values addressed, $\overline{\psi}_n(n')$ and $P_{nm}$, are applied to a multiplier 107 in which they are multiplied, after which they are added in a summing circuit 109 as soon as the summing circuit 109 receives a pulse from the clock 95 (for the next multiplication $\overline{\psi}_{n+1}(n') \cdot P_{n+1,m}$). After the divider 99 has determined at all N multiplications and additions have been performed for determining a spin density in the point n', m, the pulse conducted by the divider 99 is also applied to a trigger input 111 of the summing circuit 109, with the result that the sum determined $(=\rho(n'\pi y_o, mz_o))$ is returned to the memory 33. The nuclear spin density determined $(n'\pi y_o, mz_o)$ is then stored in a memory location (n',m), for which purpose the outputs of the counters 101 and 105 are connected to the address inputs of the memory 33. For the counters 101 and 105 use is preferably made of ring counters, so that set and reset signals can be dispensed with.

If a device in accordance with the invention utilizes exclusively a cosine modulated gradient magnetic field, the filters 37 and 39 (see FIG. 2) may be combined to form one filter, the filter coefficients then being determined by the product of the two filters. The product of the two filters is determined by the product of the matrix Snn' and the matrix $\overline{\psi}_n(n')$.

It has also been assumed that the variation of the gradient magnetic fields is linear. However, this is not absolutely necessary. There are indications that it is already sufficient for the gradients of the magnetic fields to increase monotonously, where filtering still produces an unambiguous relationship between the contributions of the varous frequencies and the nuclear spin density in a location in the (in this case) selected y-z plane which is determined by the frequency.

The central control unit 45 determines at which instant which part of the device shown in FIG. 2 is active. During a first phase, the parts 17 and 1, 19 and 3, 25 and 11 are switched on. During this phase, the selected slice is excited. During a second phase, the parts 17 and 1, 21 and 5, 23 and 7, 27 and 11, 28, 29, 31 and 33 are active. During this second phase, the nuclear spin is influenced by the gradient magnetic fields $B_1$ and $B_2$ and the free induction signal generated by the nuclear spin is measured, sampled, digitized and stored. During a third phase, the measuring values stored are Fourier transformed and stored again. During the third phase, the parts 35 and 33 are active. During a fourth phase, either the parts 33, 37 and 41 become active, or the combination of the filters 37 and 39 and the memories 33 and 41. During this phase, in the case of squarewave modulation, a nuclear spin density distribution is calculated by means of the filter 37 and the filter coefficients stored in the memory 41. This nuclear spin density distribution can subsequently be displayed on a monitor 43. If cosine modulation of the gradient magnetic field is concerned, the combination of the filters 37 and 39 determines a nuclear spin density distribution in cooperation with the memory 41 in which the filter coefficients are stored.

What is claimed is:

1. A method of determining a nuclear spin density distribution in a part of a body, comprising the following steps:
   a. the generating of a stationary and uniform magnetic field,
   b. the excitation of nuclear spins in a preselected slice so that the nuclear spins in this slice are oriented transversely of the direction of the uniform field,
   c. the subsequent observation and periodic sampling of a free induction signal which is generated by the nuclear spins situated in the slice, the nuclear spins being influenced by at least two gradient magnetic fields whose field directions extend in the direction of the uniform magnetic field, the directions of the field gradients being perpendiculr with respect to each other, a first one of said gradient magnetic fields being stationary and the second field being amplitude modulated as a function of the time, a number of N·M samples being taken during a measuring period T,
   d. the Fourier transformation of the number of samples in order to obtain nuclear spin density data concerning a nuclear spin density distribution at points which are situated on rows and columns in the selected slice, the rows extending parallel to the gradient direction of the modulated magnetic field, a resolution of the nuclear spin density distribution in the selected slice in the direction of a row being determined by the intensity and the frequency of the modulated field and in the direction of a column by the measuring period T and the intensity of the stationary gradient magnetic field, characterized in that the data obtained from the Fourier transformation, concerning a spin density distribution at points in each row, are convoluted with a weighting function in order to determine a nuclear spin density characteristic number having an index n, said weighting function comprising:
   (a) the value 1 for the nuclear spin density data having the index 2n for $|2n| \leq N$,
   (b) the value $(-1)^{n-n'}/(N \cdot \sin\{(n-n'+\frac{1}{2})\cdot\pi/N\})$ and $(-1)^{n-n'}/(N \cdot \tan\{(n-n'+\frac{1}{2})\cdot\pi/N\})$ for the nuclear spin data with an index $2n'-1$ for $|2n'-1| < N$, N being odd and even, respectively,
   (c) the value 0 for the nuclear sin density data having the index $2n' \neq 2n$, n' and n being real and integer variables for the measured nuclear spin density data and the nucelar spin density characteristic numbers, respectively, N being the maximum number of nuclear spin density characteristic numbers in a row.

2. A method as claimed in claim 1 where the intensity of the modulated gradient magnetic field is modulated with a cosine function, Characterized In That a nuclear spin density distribution $\rho$ is calculated from the nuclear spin density characteristic numbers $P_{n'm}$ obtained via convolution filtering, as a function of the location $(n'\pi y_o, m'z_o)$ in a cartesian coordinate system as follows:

$$\rho(n'\pi y_o, m'z_o) = \frac{1}{y_o z_o} \cdot \sum_n P_{n,m} \cdot F_n^{(N)}(n'\pi)$$

in which $$F_n^{(N)}(n'\pi) = \sum_{l=-\infty}^{\infty} F_{n+lN}(n'\pi), \text{ and}$$

$$F_{k/2}(x) = F_{n+lN}(x) = \frac{1}{4}(J_{k-1}(x) + J_{k+1}(x)) + \sum_{h=-\infty}^{\infty} \frac{(-1)^h}{(1-4h)\cdot\pi} \cdot J_{k+2h}(x)$$

in which n,m are indices in the y,z direction, the y direction coinciding with the gradient direction of the modulated field; $Y_o = \gamma \cdot W_1/G_y$ and $z_o = \gamma \cdot W_2/G_z$, where $\gamma$ is the gyromagnetic ratio; $w_1$, $G_y$ are the angular frequency and the intensity of the modulated gradient magnetic field, respectively; $W_2$, $G_z$ are the equivalent angular frequency and the intensity of the stationary gradient magnetic field, respectively, where $W_2 = \pi/T$ and T is the measuring period; N is the maximum number of characteristic numbers in the y direction; N·M is the number of periodic samples of the free induction signal during the measuring period T; k, l, h are variable integer and real numbers and $J_i$ are Bessel functions, the summing over n for the determination of a value of $\rho$ (y, z) extending from $-N'$ to $+N'$ for N odd, and from $-N'$ to $N'-1$ for N even, N being equal to $2N'+1$ and $2N'$, respectively.

3. A device for determining a nuclear spin density distribution in a selected slice of a body, comprising
(a) means for generating a static and uniform magnetic field,
(b) means for generating at least two gradient magnetic fields whose field direction coincides with the field direction of the uniform magnetic field, the gradient directions extending perpendicularly with respect to each other, a first gradient magnetic field being stationary and second gradient magnetic field being amplitude modulated as a function of time, (c) a high-frequency generator and coil system for generating and detecting a high-frequency electromagnetic field, (d) a frequency spectrum analyzer for separating a signal detected by means of the coil system into different frequencies and associated amplitudes, (e) a memory for the storage of at least the data of the separated high-frequency signal supplied by the analyzer, (f) an arithmetic unit for determining, on the basis of the data stored, a magnetic nuclear spin density distribution in points situated on rows and columns in the selected slice, each row extending parallel to the gradient direction of the modulated magnetic field, (g) a reproduction/recording unit for the reproduction and recording, respectively, of the magnetic nuclear spin density distribution determined, and (h) a central control unit for coordinating the elements mentioned sup a . . . g, characterized in that the arithmetic unit comprises a convolution filter for convoluting groups of nuclear spin density data, each of said groups of nuclear spin density data relating to a row, the filter coefficients of the convolution filter for determining a nuclear spin density characteristic number with an index n having the values:

a. 1 for the nuclear spin density data having the index 2n for $|2n| < N$, b. $(-1)^{n-n'}/(N \cdot \sin\{(n-n'+\frac{1}{2}) \cdot \pi/N\})$ and $(-1)^{n-n'}/(N \cdot \tan\{(n-n'+\frac{1}{2}) \cdot \pi/N\})$ for the nuclear spin density data having the index $2n'-1$ for $|2n'-1| < N$, N being odd and even, respectively, c. 0 for the nuclear spin density data having the indices $2n' \neq 2n$, n and n' being real, integer variables for the measured nuclear spin density data and the nuclear spin density characteristic numbers to be determined, respectively, N being the maximum number of nuclear spin density characteristic numbers in a row.

4. A device as claimed in claim 3, in which the amplitude of the second gradient magnetic field is modulated in time with a cosine function, characterized in that the arithmetic unit comprises a further filter for filtering the nuclear spin density numbers P(n−m) in a row, obtaned via the convolution filter, in order to determine nuclear spin density values in points having the coordinates $(n'\pi y_o, m'z_o)$, the filter being determined by $$\Psi_{nm}(n'\pi y_o, m'z_o) = F_n^{(N)}(n'\pi) \cdot \delta_{mm'} \text{ where}$$

-continued $$F_n^{(N)}(n'\pi) = \sum_{l=-\infty}^{\infty} F_{n+lN}(n'\pi) \text{ and}$$

$$F_{k/2}(x) = \frac{1}{2}(J_{k-1}(x) + J_{k+1}(x)) +$$

$$\sum_{h=-\infty}^{\infty} \frac{(-1)^h}{(1-4h) \cdot \pi} \cdot J_{k+2h}(x)$$

in which n,m are indices in the y,z direction, the y direction coinciding with the gradient direction of the modulated field; $y_o = \gamma \cdot W_1/G_y$ and $z_o = \gamma \cdot W_2/G_z$, $\gamma$ being the gyromagnetic ratio; $W_1$, $G_y$ are the angular frequency and the intensity of the modulated gradient magnetic field, respectively; $W_2$, $G_z$ are the equivalent angular frequency and the intensity of the stationary gradient magnetic field, respectively, where $W_2 = \pi/T$ and T is the measuring period; N is the maximum number of characteristic numbers in the y direction; N·M is the number of periodic samples of the free induction signal during the measuring period T; k, l, h are variable, integer and the real numbers and $J_i$ are Bessel functions, the summing over n for the determination of a value of $\rho(y,z)$ extending from $-N'$ to $N'$ for odd, and from $-N'$ to $N'-1$ for N even, N eing equal to $2N'+1$ and $2N'$, respectively.

5. A device as claimed in claim 3 or 4, characterized in that the convolution filter comprises:

(a) a first memory for the storage of the filter coefficients, (b) a second memory for the storage of nuclear spin density data with an odd index, (c) a third memory for the storage of nuclear spin data with an even index, (d) a multiplier for multiplying the filter coefficients and the nuclear spin density data in the second memory, for which purpose inputs of the multiplier are connected to an output of the first and the second memory, (e) a summing circuit which is connected to the output of the multiplier for the summing of the ouput values thereof, (f) an adder circuit which is connected to an output of the third memory and to an output of the summing circuit in order to add the sum of the output values of the multiplier, formed in the summing circuit, to a nuclear spin density data with an even index from the third memory.

6. A device as claimed in claim 5, characterized in that the first memory is a read only memory and, the second and the third memories are random access memories.

* * * * *

UNITED STATES PATENT AND TRADEMARK OFFICE
CERTIFICATE OF CORRECTION

PATENT NO. : 4,354,157
DATED : October 12, 1982
INVENTOR(S) : LOUIS F. FEINER

It is certified that error appears in the above—identified patent and that said Letters Patent is hereby corrected as shown below:

Claim 1, Line 15, "perpendiculr" should be --perpendicular--;
Line 32, change "characterized in that" to --CHARACTERIZED IN THAT--;
Line 44, change "sin" to --spin--.

Claim 2, Line 3, change "characterized in that" to --CHARACTERIZED IN THAT--;
Line 9, change "$P_n m$" to --$P_{n,m}$--;

Claim 3, Line 10, after "and" insert --a--;
Line 31, change "characterized in that" to --CHARACTERIZED IN THAT--.

UNITED STATES PATENT AND TRADEMARK OFFICE
CERTIFICATE OF CORRECTION

PATENT NO. : 4,354,157
DATED : October 12, 1982
INVENTOR(S) : LOUIS F. FEINER

It is certified that error appears in the above—identified patent and that said Letters Patent is hereby corrected as shown below:

Claim 4, Line 3, change "characterized in that" to --CHARACTERIZED IN THAT--.

Claim 5, Line 1, change "characterized" to --CHARACTERIZED--;
Line 2, change "in that" to --IN THAT--.

Claim 6, Line 1, change "characterized in" to --CHARACTERIZED IN--;
Line 2, change "that" to --THAT--.

Signed and Sealed this

Fifteenth Day of March 1983

[SEAL]

Attest:

GERALD J. MOSSINGHOFF

Attesting Officer   Commissioner of Patents and Trademarks